(12) United States Patent
Haass et al.

(10) Patent No.: US 6,876,207 B2
(45) Date of Patent: Apr. 5, 2005

(54) SYSTEM AND METHOD FOR TESTING DEVICES

(75) Inventors: Benjamin Joseph Haass, Ft. Collins, CO (US); Douglas Shelborn Stirrett, Ft. Collins, CO (US); James Kwok-Yue Wai, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/632,270

(22) Filed: Aug. 1, 2003

(65) Prior Publication Data

US 2005/0024064 A1 Feb. 3, 2005

(51) Int. Cl.[7] .................. G01R 27/00; G01R 31/28
(52) U.S. Cl. ............... 324/600; 324/73.1; 714/724; 702/117
(58) Field of Search ............... 324/765, 73.1, 324/158.1, 600; 714/724, 734, 743; 702/57, 81, 117

(56) References Cited

U.S. PATENT DOCUMENTS

| | | | | |
|---|---|---|---|---|
| 5,200,696 A | * | 4/1993 | Menis et al. | 324/158.1 |
| 5,321,702 A | * | 6/1994 | Brown et al. | 714/744 |
| 6,079,038 A | | 6/2000 | Huston et al. | 714/724 |
| 6,370,067 B1 | | 4/2002 | Ko et al. | 365/194 |
| 2001/0035766 A1 | * | 11/2001 | Nakajima | 324/765 |

* cited by examiner

*Primary Examiner*—Vincent Q. Nguyen

(57) ABSTRACT

A device testing system that has automated test equipment (ATE), which interfaces to a device under test (DUT). The device testing system selects a test set of data including a plurality of test pairs, indicative of DUT parameter values. The system, selects a subset of the plurality of test pairs from the test set of data tests the DUT via the ATE with a portion of the selected subset based upon the test results of at least one of the test pairs.

19 Claims, 9 Drawing Sheets

SYSTEM AND METHOD FOR TESTING DEVICES

BACKGROUND

A device under test (DUT), such as an integrated circuit (IC) is typically tested in a controlled environment prior to its production. Test results are oftentimes recorded, and an analysis of the recorded results provides a basis for predicting the device's failure point at varying operational parameters, e.g., operational voltage, frequency, or temperature. Commonly, test results are recorded in a two-dimensional plot, e.g., a "shmoo plot."

A shmoo plot generally exhibits the results of tests performed of a DUT's resources across defined ranges of the aforementioned operational parameters. For example, the horizontal axis of a shmoo plot might define a range of operational voltages between 1.00 volts and 1.60 volts at increments of 0.05, and the vertical axis of the shmoo plot might define a range of internal clock frequencies between 900 and 1200 hertz at increments of 15 Hertz. Moreover, for each intersection point on the shmoo plot, a voltage/frequency pair is applied to the DUT, and whether the DUT passes or fails is recorded in the shmoo plot.

A system for testing a DUT in this manner usually comprises automated test equipment (ATE) that interfaces with the DUT and that is capable of automatically varying the DUT's operational and/or environmental parameters. Oftentimes, the ATE also interfaces with a control element, e.g., a computer, that controls the ATE and records the test results. Usually, the test results comprise pass/fail data indicative of whether the DUT passed or failed, and this data is collected via the ATE. Sometimes the control element records this data in a shmoo plot, as described herein.

The recorded test results exhibited in a shmoo plot reveal the operational behavior of the DUT in that the shape of a failing region of a shmoo plot is meaningful and helps to determine the cause of a failure in the DUT. The shape of a shmoo plot typically falls into familiar categories that are recognized by descriptive names, depending upon the shape that the data takes when plotted. For example, a shmoo plot of a normal circuit operation usually shows better high frequency performance as supply voltage increases, and as such its shape resembles a "shmoo," which is a mid-twentieth century Lil'Abner cartoon character. However, the shmoo plot may take various identifying forms depending upon the type of failure, if any, that is exhibited by the DUT.

Testing of a DUT at varying operational parameters usurps extensive time and resources in light of the procedures used to obtain sufficient data for defining a shmoo plot. In this regard, if a shmoo plot comprises, for example, ten (10) operational voltages in the horizontal axis and ten (10) internal clock frequencies in the vertical axis, then obtaining a complete shmoo plot for the DUT would require that one hundred tests be run and recorded. Thus, testing a DUT and recording values indicative of the test results slows the research, development and manufacturing process of ICs.

SUMMARY OF THE DISCLOSURE

Generally, the present disclosure describes embodiments of systems and methods for testing the operational behavior of a device at varying parameters.

A test system in accordance with one such embodiment comprises automated test equipment (ATE) configured to interface to a device under test (DUT) and logic configured to select a test set of data comprising a plurality of test pairs, the test pairs indicative of DUT parameter values, the logic further configured to select a subset of the plurality of test pairs from the test set of data and to test the DUT via the ATE with a portion of the selected subset based upon the test results of at least one of the test pairs.

A device testing method in accordance with an exemplary embodiment of the present disclosure comprises the steps of: selecting a test set of data comprising a plurality of test pairs, the test pairs indicative of device-under-test parameter values; selecting a subset of test pairs from the plurality of test pairs; and testing the device-under-test via automated test equipment with a portion of the selected subset based upon the test results of at least one of the test pairs.

BRIEF DESCRIPTION OF THE DRAWINGS

The present disclosure can be better understood with reference to the following drawings.

DETAILED DESCRIPTION

Generally, embodiments of the present disclosure provide systems for testing the operational behavior of a device under test (DUT). One such embodiment provides a testing system that systematically reduces the number of times that a DUT is actually tested, while continuing to provide test results that accurately reflect a DUT's operational behavior.

The testing system preferably comprises testing logic that first establishes a "test set." A test set comprises a plurality of "test pairs," in which each test pair comprises a horizontal value and a vertical value. Each horizontal value and vertical value is preferably indicative of an operational parameter value (e.g., a voltage value or a frequency value). Note that the use of the term "horizontal" and "vertical" with reference to the values comprising the test pair are to demonstrate that one such value of the test pair preferably refers, in this context, to a value that is one in a set of values making up a horizontal or vertical axis of a plot that illustrates the operational behavior of a DUT.

Preferably, the system tests the DUT using test pairs contained within the test set. In the course of testing the DUT, the testing logic selects a subset of test pairs within the test set as a starting point for use in actual testing of the DUT. The testing logic then effectuates testing, preferably through automated testing equipment (ATE), by systematically applying at least a portion of the test pairs contained with the selected subset. Upon receipt of test results for a portion of the test pairs of the subset, the testing logic records such test results, and if the testing logic concludes that the test results obtained with the subset can be used to predict the test results for the remaining test pairs in the test set, then the testing logic performs such prediction, e.g., the testing logic uses the obtained test results in an interpolation calculation to obtain the test results for the remaining test pairs in the test set. A test result comprises a value indicative of the success or failure of the DUT when the DUT is tested using the horizontal value and vertical value of the test pair. The actual test results and predicted test results are preferably recorded in a plot, e.g., a shmoo plot, at the location in the plot corresponding to the horizontal value and the vertical value of the related test pair.

Figure 1:
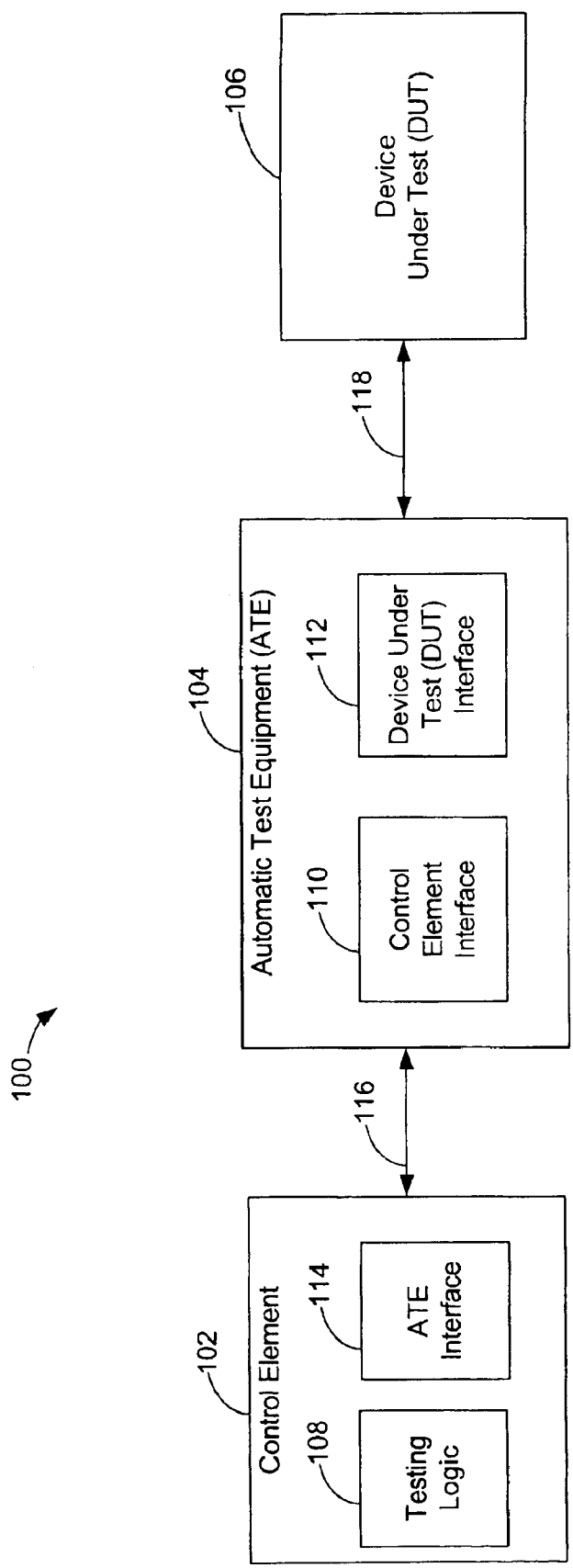
FIG. 1 is a block diagram illustrating an exemplary embodiment of a testing system.

An exemplary embodiment of a testing system 100 is depicted in FIG. 1. System 100 preferably comprises a control element 102, ATE 104, and a DUT 106. The ATE 104 comprises a DUT interface 112, for example, such as a socket for receiving input/output pins of the DUT 106. In addition, the ATE 104 preferably comprises a control element interface 110, which is communicatively connected to the control element 102 via an ATE interface 114. The control element 102 generally controls operation of the ATE 104 by communicating with the control element interface 110 of the ATE 104.

As shown by FIG. 1, the control element 102 comprises testing logic 108, The testing logic 108 determines the test set that is used in the selection of a test subset of test pairs, which can be used to test the DUT 106. As described in more detail hereinabove, the test set comprises a plurality of potential test pairs from which the testing logic 108 uses in its selection of a test subset of test pairs that the testing logic actually uses to test the DUT 106. The horizontal values contained within the test pairs of the test set relate to a single type of testing parameter, and the vertical values relate to a different type of testing parameter (e.g., if the horizontal values relate to a operational voltage, then the vertical values might relate to operational frequency). The test results obtained and the test results predicted are plotted at the horizontal and vertical locations corresponding to the result's test pair, and the resulting plot can provide a meaningful tool by which to analyze the operational behavior of the DUT 106.

Note that the type of testing parameters used by the testing logic in testing the DUT 106 and the ranges related may be designated by a user. For example a user may enter parameter types and testing ranges into a graphical user interface associated with the system 100. In another example, the testing logic 108 may automatically determine parameter types and corresponding testing ranges to be used in performance of the automated testing of an IC.

The testing logic 108 does not effectuate performance of an actual test of the DUT 106 for each test pair of the test set. In this regard, after the test set has been defined, the testing logic 108 reduces the number of test pairs with which the testing logic 108 will effectuate testing of the DUT 106. The subset of test pairs actually used to test the DUT 106 includes only a subset of the previously determined test set, and the parameter values associated with such test pairs are the values that are used in the actual testing of the DUT 106. The aforementioned test subset is selected and used in actual testing in lieu of the previously determined test set so that fewer tests will be performed, thereby reducing the amount of time and resources required to obtain operational information about the DUT 106.

Once a test pair has been used in testing the DUT 106, e.g., once the DUT 106 has operated with the voltage value and frequency value defining the test pair, the testing logic 108 receives a value indicative of a test result for the foregoing test pair from the ATE interface logic 114, which is connected to the ATE 104 via the communication link 116. Testing logic 108 analyzes the results obtained for the test pairs of the subset and interpolates the pass/fail data for such test pairs, thereby accurately and efficiently reflecting a test profile over the entire test set of the DUT 106. The testing logic 108, when selecting the test pairs for the test subset, preferably selects the test pairs such that these selected test pairs resemble the shape of a cross, hereinafter referred to as a cross shmoo. Exemplary techniques for effectuating the foregoing will be described in more detail hereafter.

It should be noted that the testing logic may be implemented in software, hardware, or a combination thereof. As illustrated by way of example in FIG. 2, the testing logic 108 and associated methodology may be implemented in software and stored in memory 212 of the control element 102.

Note that when implemented in software, testing logic 108 can be stored and transported on any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. Note that the computer-readable medium could even be paper or another suitable medium upon which the program is printed, as the program can be electronically captured, via for instance optical scanning of the paper or other medium, then complied, interpreted or otherwise processed in a suitable manner if necessary, and then stored in a computer memory. As an example, the components of the testing logic 108 may be magnetically stored and transported on a conventional portable computer diskette.

The exemplary embodiment of the control element 102 comprises at least one processing element 202, such as a digital signal processor (DSP) or a central processing unit (CPU), for example, that communicates to and drives the other elements within the control element 102 via a local interface 204, which can include one or more buses. The control element 102 may also include an input device 206, for example, a keyboard or a mouse, that can be used to input data from a user of the control element 102, and an output device 208, for example, a screen display or a printer, can be used to output data to the user. The control element 102 preferably further comprises automated test equipment interface 114 that allows the control element 102 to exchange data with the ATE 104 (FIG. 1) over a connection 116 (FIG. 1), such as a network, for example.

In one embodiment, the testing logic 108 displays on the output device 208 a graphical user interface (GUI). A user can then dialogue with the testing logic 108 by responding to the GUI via the input device 206, which receives information from the user relative to the testing logic 108. For example, the user can select the type of parameters that will be varied in the current testing, e.g., voltage, frequency and/or temperature.

In addition to providing the type of parameters that are to be used in the current testing, the user can also specify a testing range for each parameter. For example, if the user selects voltage as one of the testing parameters, then the user may also be prompted by the GUI via the output device 208 to enter a range of voltages to be tested, e.g., 1.00 volts through 1.60 volts. In addition, the GUI may prompt the user to specify a second range corresponding to a second parameter indicated by the user. For example, if the user indicates frequency as the second parameter, then the GUL via the output device 208, can prompt the user to enter the second range, e.g., 1200 hertz through 900 hertz. Note that the two parameters and their corresponding ranges provide the horizontal and vertical axis data for the two-dimensional plot in which the DUTs operational behavior is recorded.

The testing logic 108 generates a two-dimensional plot by using one of the parameters indicated by the user as the horizontal axis of the plot and by using the other parameter indicated by the user as the vertical axis of the plot. For example, the testing logic 108 may generate a plot having a horizontal axis exhibiting voltage values with a specified range from 1.0 Volts to 1.60 Volts in increments of 0.05 Volts and a vertical axis exhibiting frequency values with a range from 900 Hertz to 1200 Hertz in increments of 15 Hertz. In such an example, a test set comprising frequency values 306 and voltage values 304 of test pairs are defined by the user's inputs.

The testing logic 108 selects a subset of the test set defined by the horizontal and vertical axis. The selected subset is preferably in the shape of a cross superimposed on the two-dimensional plot as discussed hereinabove, i.e., a cross shmoo. The horizontal portion of the cross shmoo corresponds to the parameter type of the horizontal axis of the plot and the vertical portion of the cross shmoo corresponds to the vertical axis of the plot. The testing logic 108 preferably positions the cross shmoo on the two-dimensional plot at a randomly selected location or at a location corresponding to the nominal frequency and nominal voltage of the DUT 106. Note that nominal operational values are indicated for a DUT, for example, in the DUT's specification sheet or on the DUT, itself, by its manufacturer.

Figure 2:
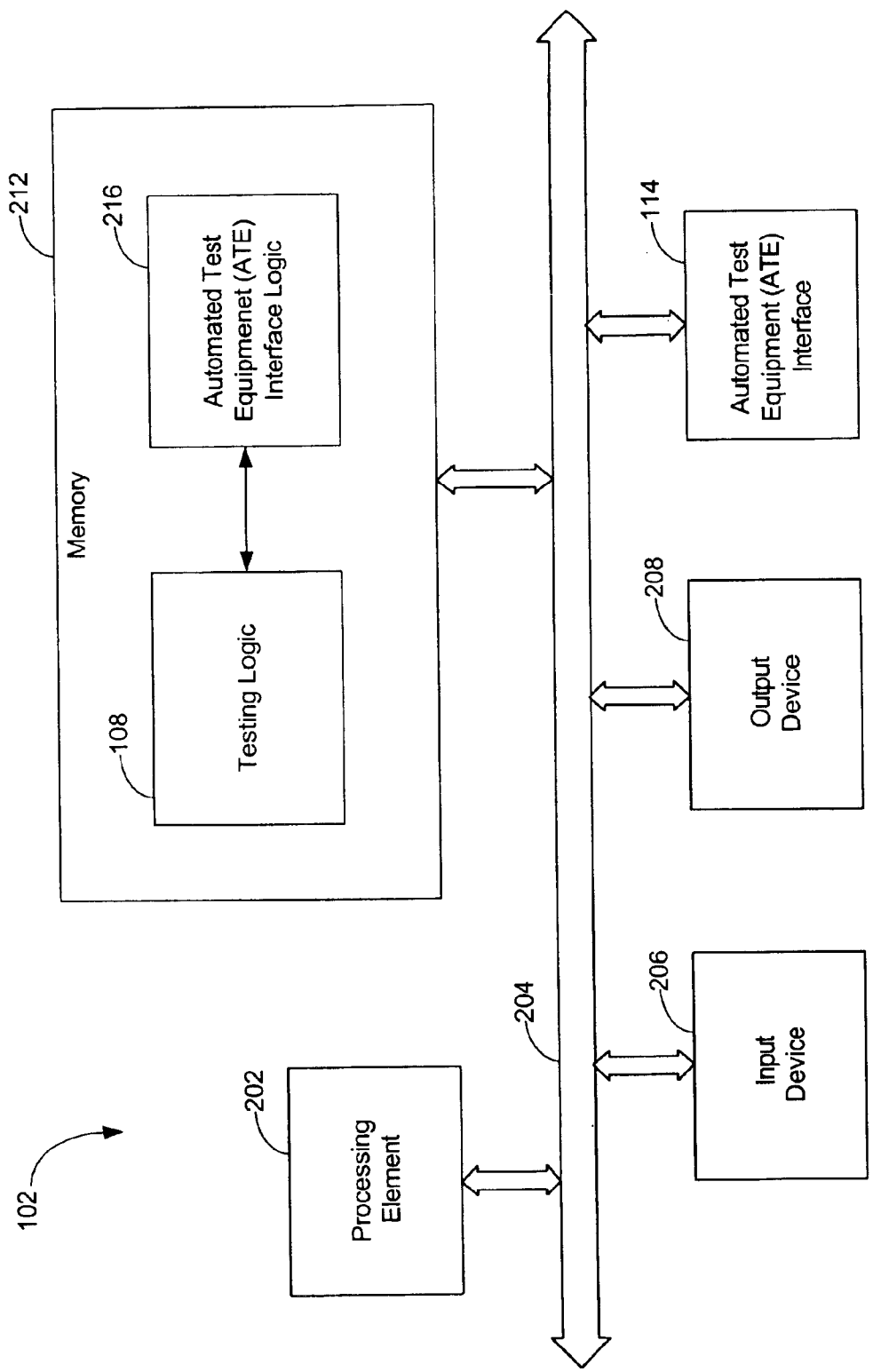
FIG. 2 is a block diagram illustrating an exemplary embodiment of a control element of the testing system depicted in FIG. 1.
Figure 3:
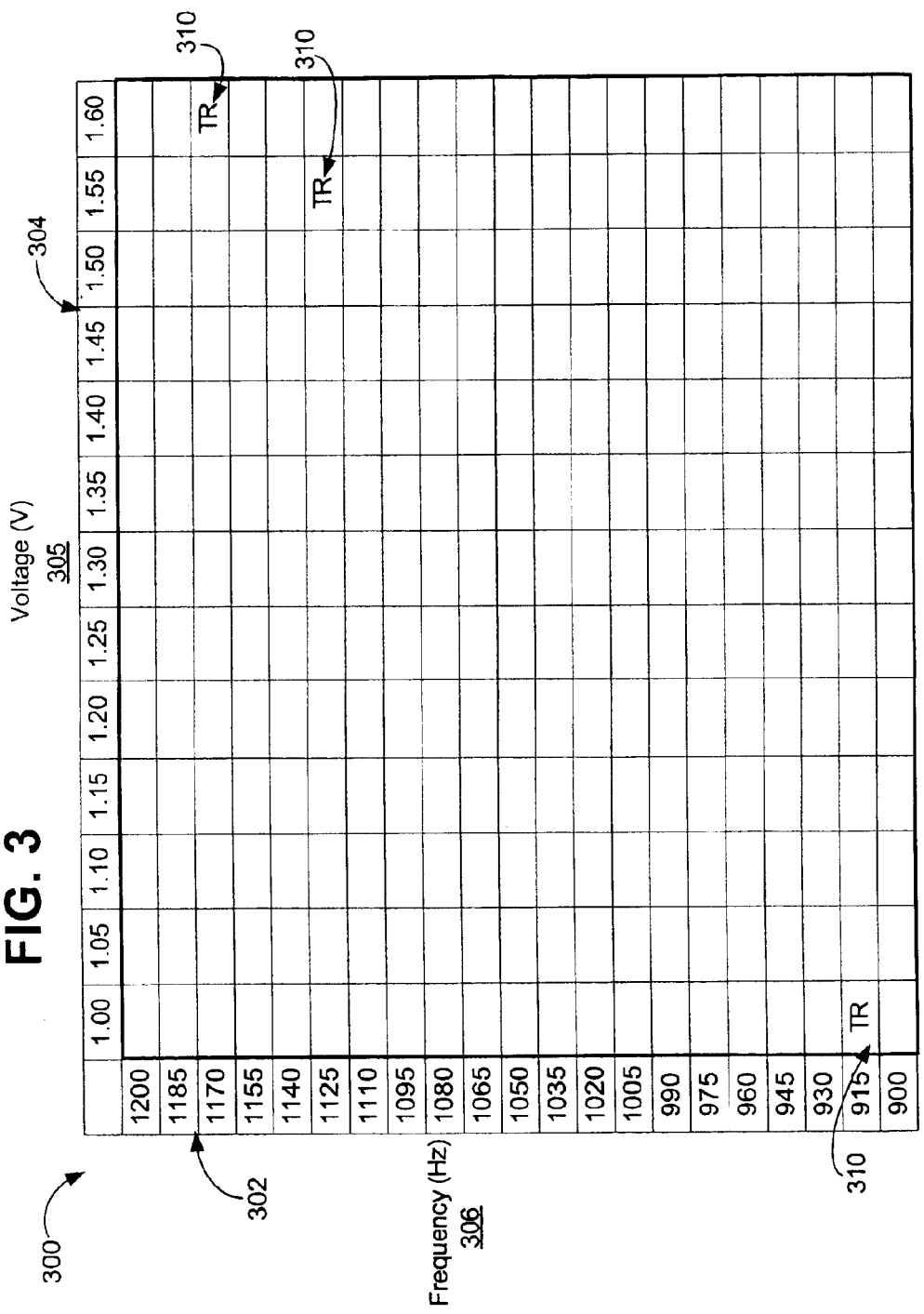
FIG. 3 is a plot illustrating test pairs associated with a frequency test range and a voltage test range.

FIG. 3 illustrates a plot 300 comprising a vertical axis 302 defining a range of internal clock frequencies 306 of a DUT 106 (FIG. 2). The range includes a minimum value of 900 Hertz to a maximum value of 1200 Hertz and is illustrated in increments of 15 Hertz. Further, plot 300 comprises a horizontal axis 304 defining a range of operational voltages 305 of a DUT 106. The range of voltages 305 includes a minimum value of 1.00 Volts to a maximum value of 1.60 Volts and is illustrated in increments of 0.05 volts.

Each test pair, e.g., a frequency value 306 and a voltage value 305, corresponds to a test result 310 in the plot 300. Hence, plot 300 includes 273 test pairs corresponding to 273 test results 310. In this regard, the test pair defined by the 1200 hertz/1.00 volts has a corresponding test result 310. Note that each block corresponding to a test pair in the plot is a test result (TR) 310, however, for simplicity only a sample of blocks are provided reference numerals. Note that 1200 Hertz corresponds to the vertical value of the test pair in relation to the plot, and 1.00 Volts corresponds to the horizontal value of the test pair in relation to the plot. The DUT 106 could be tested using each of the test pairs indicated in the plot 300 to obtain 273 TRs 310, and a test result value obtained from the ATE 104 could be recorded and plotted for each test pair test result 310. Such a plot would illustrate the operational behavior of the DUT for the parameters tested, i.e., frequency and voltage.

Figure 4:
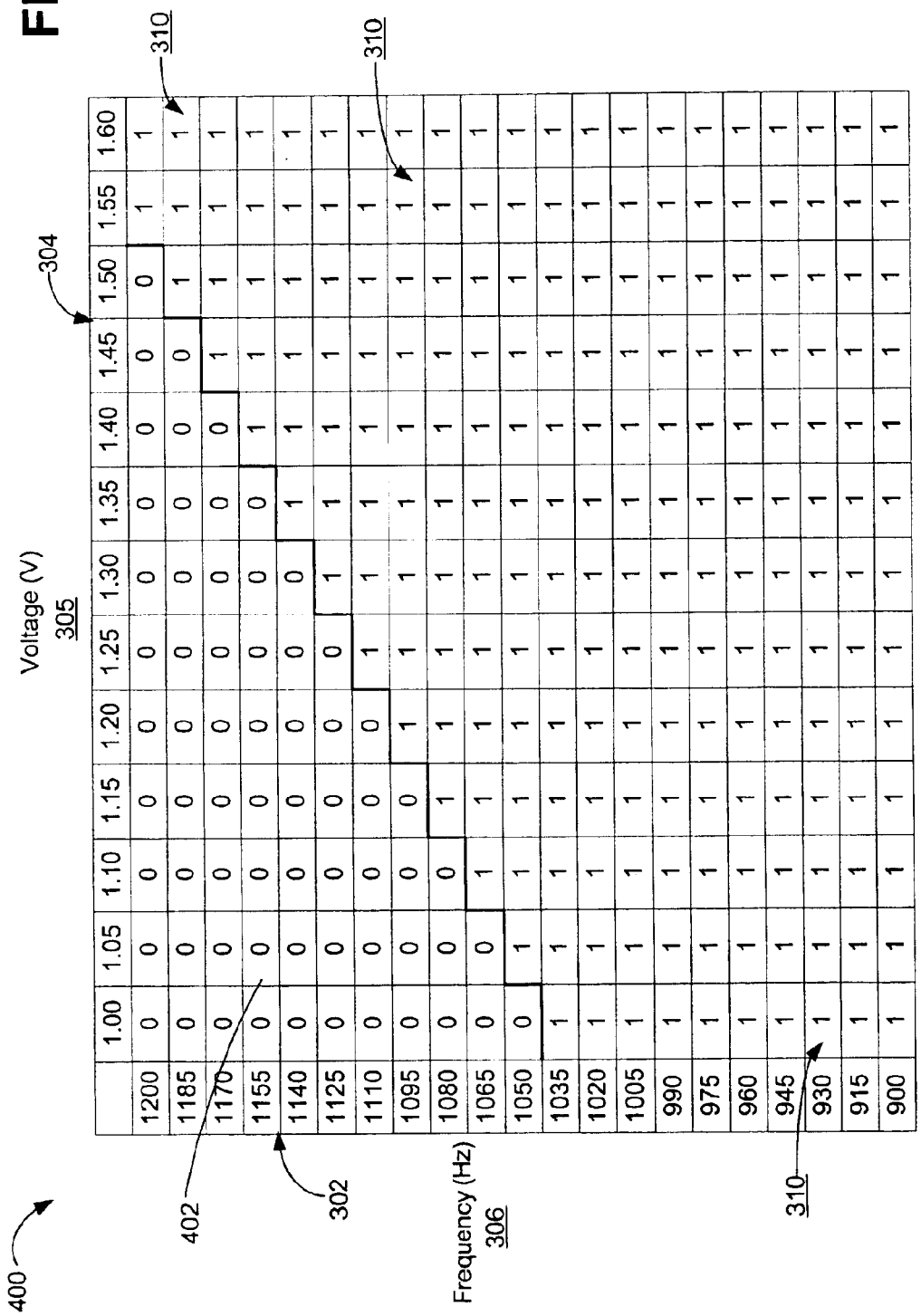
FIG. 4 is a plot exhibiting test results for test pairs as depicted in FIG. 3.

FIG. 4 illustrates a plot 400 that exhibits an exemplary arrangement of test results 310 as illustrated by plot 300 of FIG. 3. The portion 402 of the plot 400 exhibiting zeros ("0"s) (e.g., 1200 Hz/1.0 V, 118 Hz/1.0V, 1110 Hz/1.20 V) represents test results for test pairs for which the DUT 106 (FIG. 1) failed for the corresponding test pair. The remaining portion of the plot 400 exhibiting ones ("1"s) represents test results for test pairs for which the DUT 106 passed for the corresponding test pair. As noted herein, the test results 310 shown in plot 400 can be obtained by testing the DUT 106 (FIG. 1) with each test pair to obtain each test result 310.

Figure 5:
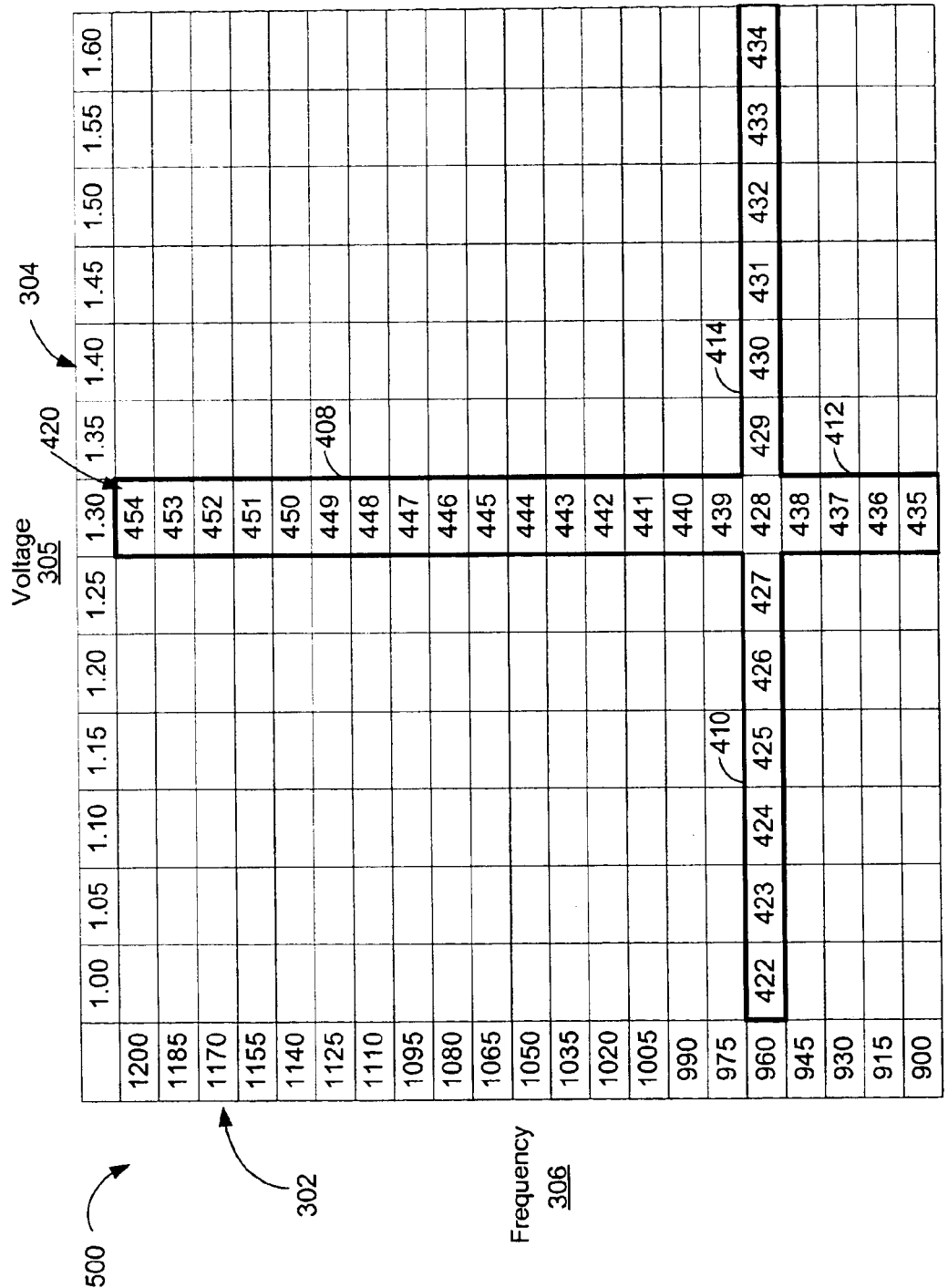
FIG. 5 is an exemplary plot illustrating a plot with a defined cross intersecting at a frequency of 960 hertz and a voltage of 1.00 volts.

FIG. 5 illustrates a plot 500 that identifies a subset 420 of the test set in the shape of a cross superimposed on the plot 500. Much like plot 400 of FIG. 4, plot 500 comprises a horizontal axis 302 defining a range of frequencies 306 from 900 hertz to 1200 hertz and a vertical axis 304 defining a range of voltages 305 from 1.00 to 1.60 volts. The testing logic 108 (FIG. 2) selects either randomly, or via a nominal value selection, as described herein, a location on the plot for locating the cross shmoo 420. For illustrative purposes, the nominal frequency of the DUT is 960 hertz and the nominal voltage is 1.30. Thus, the testing logic 108 selects the horizontal portion of the cross shmoo 420 at 960 hertz on the shmoo plot 500. The horizontal portion comprises a left leg 410 and a right leg 414. Further, the testing logic 108 (FIG. 2) selects a vertical portion of the cross shmoo 420 at 1.30 volts on the shmoo plot 500. The vertical portion of the cross shmoo 420 comprises a top leg 408 and a bottom leg 412.

The left leg 410 of the horizontal portion is defined by test pairs corresponding to test results 422–428, inclusive, and the right leg 414 is defined by test pairs corresponding to test results 428–434, inclusive. The top leg 408 of the vertical portion is defined by test pairs corresponding to test results 428–454, inclusive, and the bottom leg 412 is defined by test pairs corresponding to test results 428–435, inclusive. Note that the remaining test pairs shall be referred to herein as "the remaining plurality of test pairs 310."

The testing logic 108 first tests the end points of the horizontal portion and the vertical portion and tests the center point of the cross shmoo 420, including test pairs corresponding to test results 422, 434, 435, 454, and 428. The testing logic 108 obtains test results for each of these test pairs by transmitting to the ATE 104 via the connection 116, the frequency/voltage values corresponding to the test pairs associated with each of the test pairs. Upon receipt of the results of the tests of the selected test pairs (i.e., test pairs 422, 434, 435, 454, and 428), the testing logic 108 determines if all the test pairs failed. If all the test pairs failed, then the current DUT 106 (FIG. 1) is not operating properly. In such an example, it can be assumed that no test pair in the cross shmoo or the remaining plurality of test results 310 in the plot 500 will pass, and this assumption is further illustrated by interpolating the five test pairs over the entire test set of test pairs 310. Likewise, if all the test pairs 422, 434, 435, 454, and 428 pass, it can be assumed that all the test pairs in the cross shmoo and the remaining plurality of test results 310 will pass.

If some of the test pairs pass and some of the test pairs fail, then the testing logic 108 determines test results for each leg. The testing logic 108 determines the test results for the left leg 410 for the leg end points, e.g., test pair 422 and test pair 428. If one of the test results for one end point exhibits a value indicating that the DUT 106 passed and one of the test results for the second end point exhibits a value indicating that the DUT 106 failed, then the testing logic 108 performs a binary search on the left leg 410 to determine a transition point, i.e., a point on the leg 410 that the test result obtained from testing the DUT 106 transitions from one state to another, i.e., from a pass value to a fail value or vice versa. Note that a binary search is a type of algorithm that seeks a known value, e.g. a pass indication value or a fail indication value, in a list of values, e.g., the test result values of the leg 410, by first comparing the value sought, ie., a pass indication value "1", to the value in the middle of the list's order. The binary search then divides the list in two, determines in which half of the list the value should be, then repeats the process until the value is found.

The testing logic 108 performs the aforedescribed process for each leg of the cross shmoo and interpolates the results obtained over the remaining plurality of test results 310 and any other test result value in the cross shmoo that were not actually tested to obtain a visual representation of the operational behavior of the DUT 106 (FIG. 1).

As an example, assume that the left leg 410 for test pairs 422 through 428, respectively exhibit the values {1, 1, 1, 0, 0, 0, 0}, wherein a "1" indicates that the DUT passed and a "0" indicates that the DUT failed.

The testing logic 108 determines whether the end points of the cross shmoo, including test pair 422, 434, 435, 454, and 428 all failed. If all the test pairs indicate that the DUT 106 failed, then the testing logic 108 creates a plot that exhibits failing values for all the test pairs test pairs 422–454. However, if at least one test pair of test pair 422, 434, 435, and 454 pass, then the testing logic 108 individually analyzes the left leg 410, the right leg 414, the top leg 408, and the bottom leg 412 of the cross shmoo 420.

The testing logic 108 then begins testing the left leg 410 by obtaining a pass/fail value for test pair 422 and test pair 428. For the example provided, test pair 422 indicates a "1," which indicates that the DUT passed for the corresponding test pair, frequency equals 960 hertz and voltage equals 1.00 volts. Further, test pair 428 in the example provided indicates a "0," which indicates that the DUT 106 failed for test pair 428 of the left leg 410. The testing logic 108 then performs a binary search on the left leg value by comparing the passed value, "1," to the value in the middle of the left leg 410, i.e., the pass/fail value at test pair 4. The value, "0," is not equal to the value sought, "1." Therefore the testing logic 108 divides the left leg 410 into two subsets, the first set including those remaining points to the left of test pair 425 including test pairs 422–424, and a subset including those remaining points to the right of test pair 425, including test pairs 426–427. Because the value "0" is not equal to the value at test pair 422, "1" then the testing logic 108 determines that the transition point sought is not located in the second subset including test pairs 426–427, but the transition point is located in the first subset to the left of test pair 425, including test pairs 422–424. The testing logic 108 then tests the DUT 106 at a point in the middle of the first subset, including test pairs 422–424, which would be at test pair 423. In the example provided, test pair 423 exhibits a test value of "1", which is equal to the value sought. Therefore, the testing logic 108 determines via the binary search that the transition point is test pair 425.

Testing logic 108 performs the binary search on each of the legs, the left leg 410, the right leg 414, the top leg 408, and the bottom leg 412, and determines the transition points, if a transition point exists in each leg. The testing logic 108 then interpolates over the entire shmoo plot 500 to determine the values at each test pair in the plot 500. Therefore, testing of the DUT 106 for each point in the cross shmoo, points 422–454, of the shmoo plot 500 or testing of the DUT 106 for the remaining pairs 310 of the plot 400 in FIG. 4, is not necessary. The number of test pairs that are tested to determine an informative plot are reduced and the information for determining the operational behavior of the DUT is obtained.

An exemplary embodiment of an architecture and functionality of the testing logic of FIG. 2 is described with reference to FIGS. 6–8.

Figure 6:
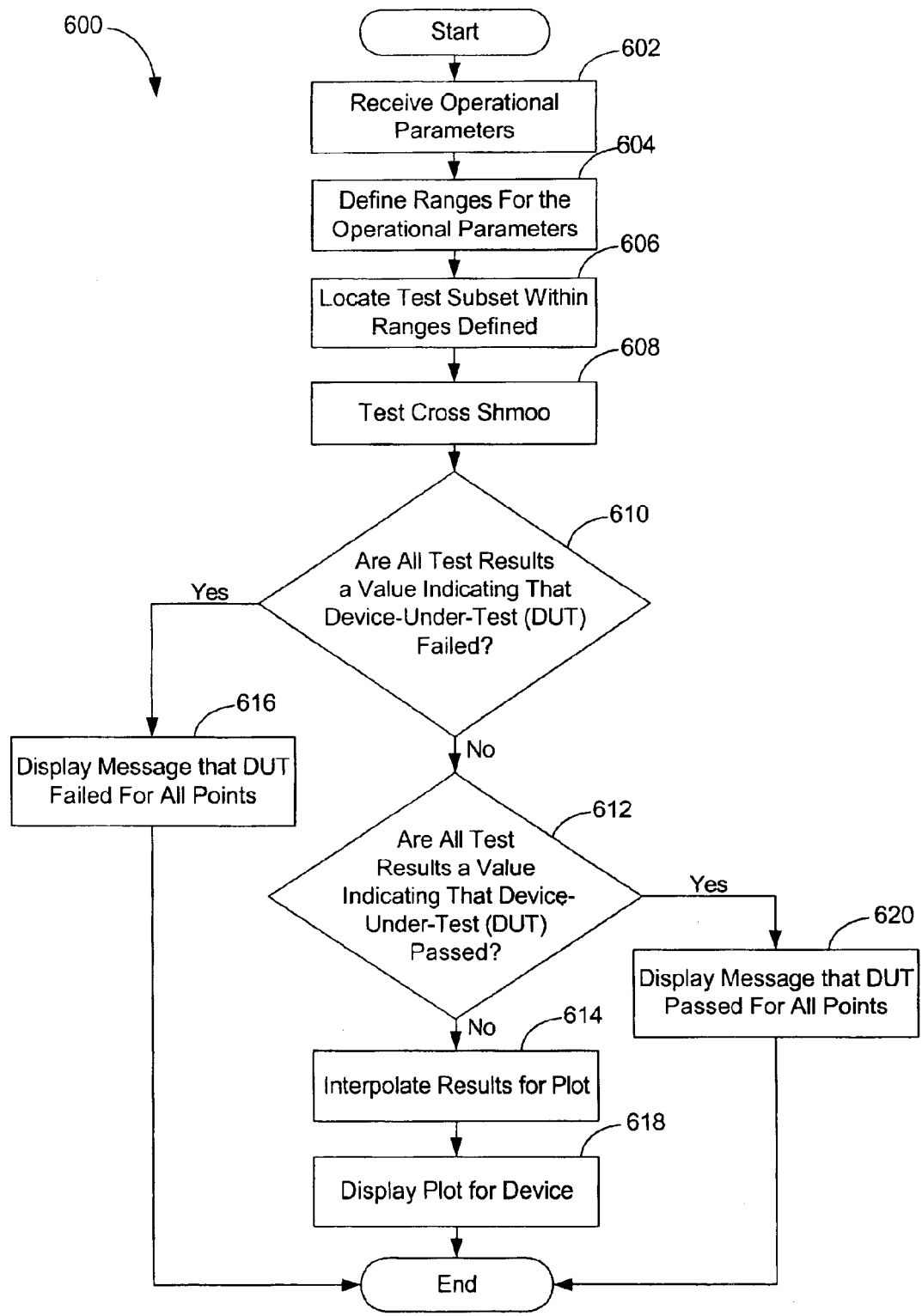
FIG. 6 is a flow chart illustrating an exemplary embodiment of an architecture and functionality of testing logic depicted in FIG. 1.

With Reference to FIG. 6, the testing logic 108 (FIG. 2) first receives parameters for the shmoo plot, as indicated in step 602, via the input device 206 (FIG. 2). As described herein, the parameters may be received via a GUI displayed on the output device 208 (FIG. 2). A user preferably specifies test value types, e.g., frequency, voltage, or temperature, and/or nominal operational values, e.g., 960 Hertz for nominal frequency and/or 1.30 volts for nominal voltage, for the DUT 106. The testing logic 108 then defines ranges for the test value types of the shmoo plot, as indicated in step 604. For example, if a user specifies a test type, for example frequency, then the testing logic 108 may select a range for the shmoo plot based upon the nominal frequency specified by the user, e.g., the testing logic may choose a range of 900 Hertz to 1200 Hertz for the frequency range, where the user specified a nominal frequency for the DUT of 960 Hertz. Alternatively, the user may specify the range via the GUI.

The testing logic 108 locates a cross shmoo 420 on the shmoo plot within the ranges defined by the testing logic 108, as indicated in step 606. As described herein, the cross shmoo 410 may be placed at a random location on the shmoo plot or the testing logic 108 may locate the cross shmoo 420 at nominal frequency and nominal voltage of the DUT 106. The testing logic 108 then tests the cross shmoo 420, as indicated in step 608, and obtains test result values for each test pair defining the cross shmoo. If all the test pairs in the cross shmoo are set to a value indicating that the DUT 106 failed, as indicated in step 610, then the testing logic 108 displays, via the output device 208, a message indicating that the DUT 106 failed for each test pair in the shmoo plot, as indicated in step 616. If all test pairs in the cross shmoo are set to a value indicating that the DUT 106 passed, as indicated in step 612, then the testing logic 108 displays via the output device 208, a message indicating that the DUT 106 passed for each test pair in the shmoo plot, as indicated in step 620. If all the points in the cross shmoo do not indicate that all the points failed or all the points passed, then the testing logic 108 interpolates the results of the cross shmoo across each test pair in the shmoo plot, as indicated in step 614. The testing logic 108 may then display via the output device 208, a shmoo plot for the DUT 106 (FIG. 1).

Figure 7:
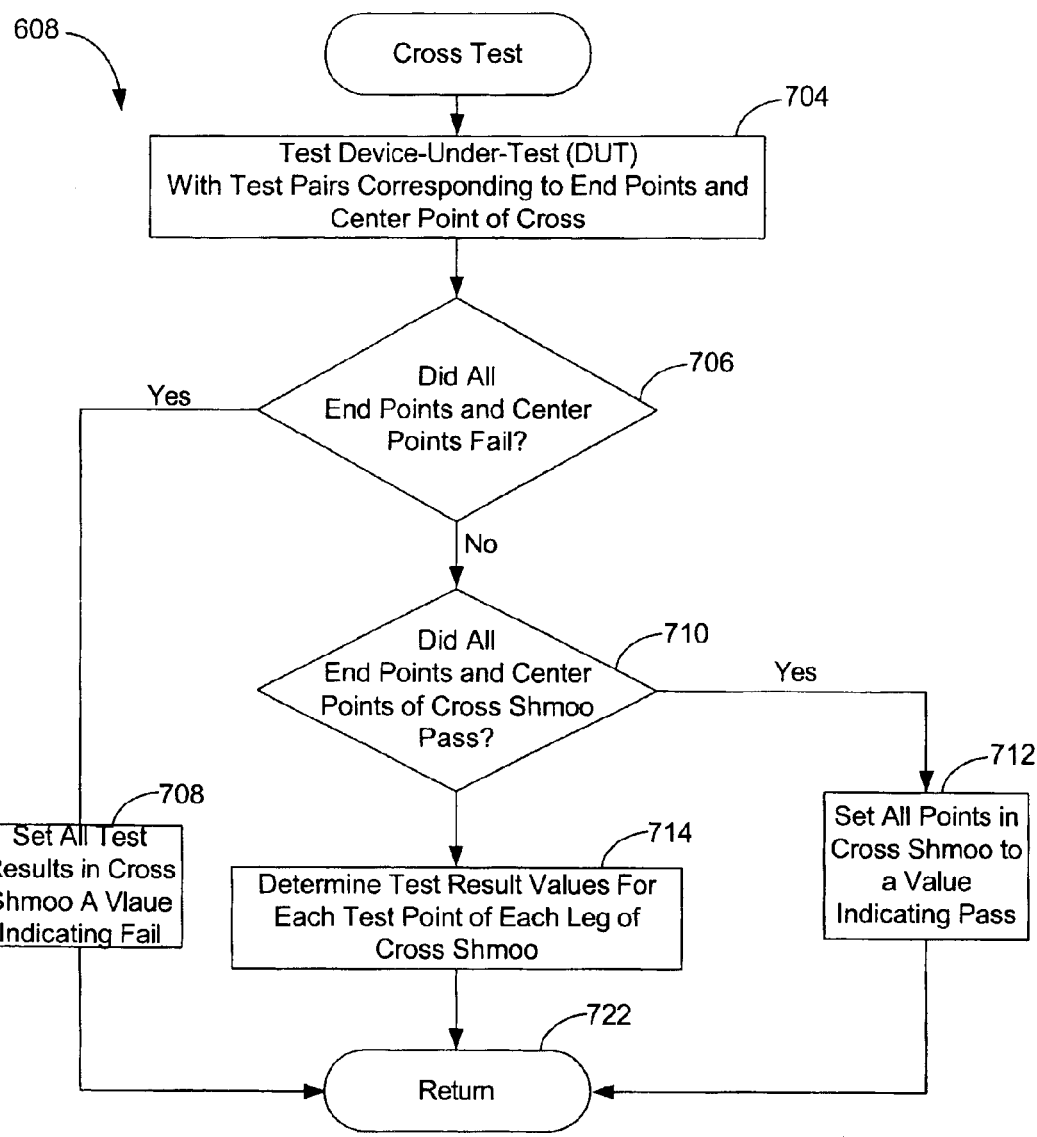
FIG. 7 is a flow chart illustrating an exemplary embodiment of an architecture and functionality of the testing logic depicted in FIG. 1.

FIG. 7 illustrates an exemplary architecture and functionality of the testing logic 108 for testing selected points of the cross shmoo and obtaining a test result value for each test pair defining the cross shmoo. The testing logic 108 first tests the DUT 106 with the values corresponding to the end points and the center point of the cross shmoo, as indicated in step 704.

If the end points and the center point of the cross shmoo fail, as indicated in step 706, then all of the remaining points in the cross shmoo are set to a value that indicates that the DUT 106 failed for the parameter values associated with the corresponding test pairs and the cross shmoo testing terminates, as indicated in 722. If all the end points and the center point of the cross shmoo pass, as indicated in step 710, then all of the remaining points in the cross shmoo are set to a value that indicates that the device passed for the parameter values associated with the corresponding test pairs and the cross shmoo testing terminates, as indicated in step 722.

If, however, some of the end points and/or the center point fail and some of the end points and/or center point pass, then the testing logic 108 determines test result values for each test pair of each leg of the cross shmoo, as indicated in step 714.

Figure 8:
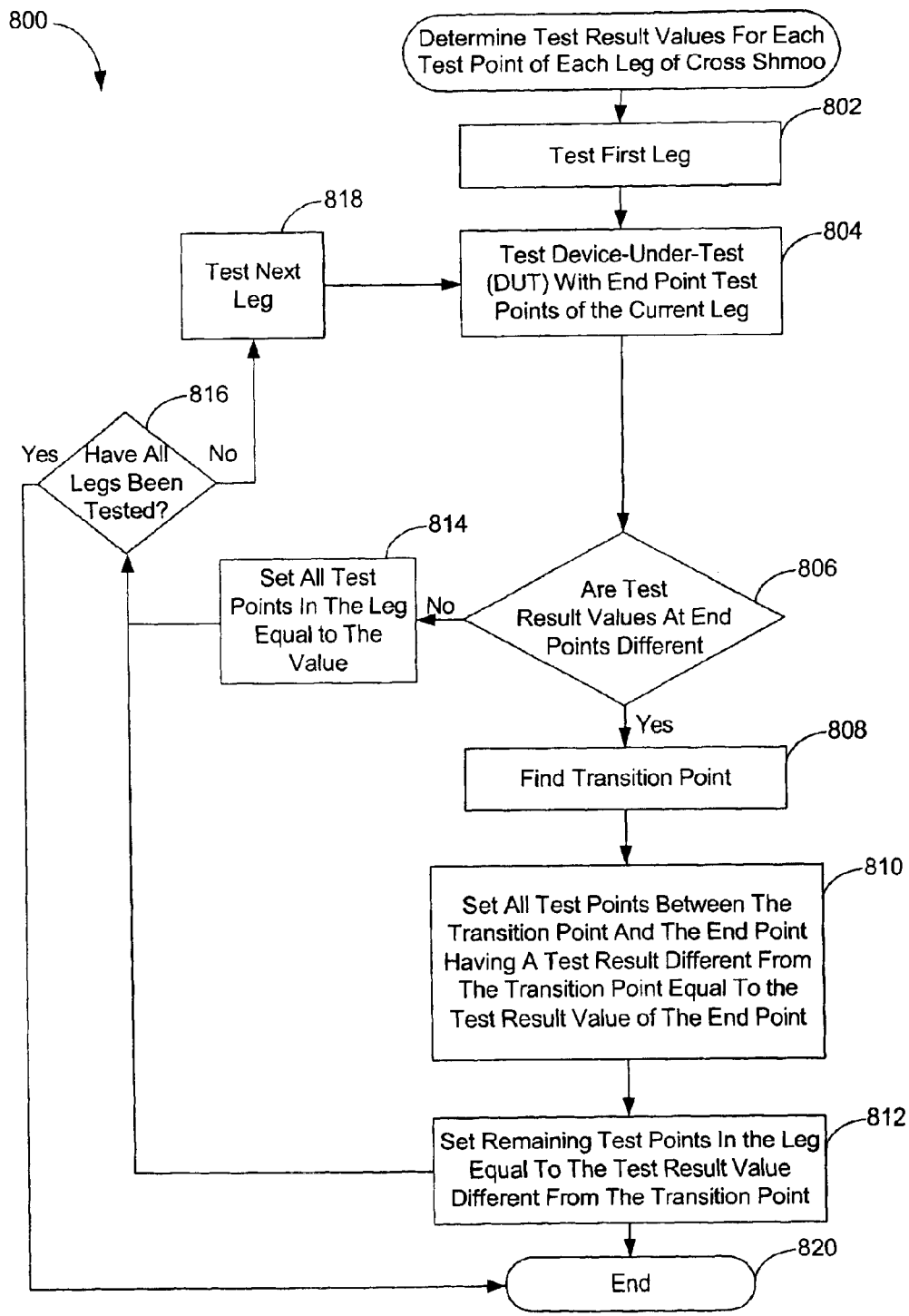
FIG. 8 is a flow chart illustrating an exemplary architecture and functionality of the testing logic depicted in FIG. 1.

FIG. 8 illustrates an exemplary architecture and functionality of step 714 of FIG. 7. As indicated in step 802, the testing logic 108 test a first leg of the cross shmoo. As indicated in step 804, the testing logic 108 tests the DUT 106 with the parameter values associated with the end point test pairs of the current leg. If the end points of the current leg do not provide different results upon testing of the DUT, for example, if both end points return a test result value indicating that the DUT fail for each end point, then the testing logic 108 sets all the test pairs in the leg equal to the value of the test result. For example if both end points failed, then the testing logic 108 sets all the test pairs in the leg equal to the value that indicates that the DUT failed, as indicated in step 814. If all the legs have been tested and values have been obtained for all the test pairs in each leg, as indicated in step 816, then the determination of the test result values for each leg of the cross shmoo ends as indicated in step 820. If all the legs of the cross shmoo have not been tested, then the testing logic 108 tests the next leg as indicated in step 818.

If, at step 806, the test result values of the end points are different, then the testing logic 108 determines the transition point in the current leg from one test result state to another. For example, if one end point exhibits a test result value indicating that the DUT passed, and the other end point exhibits a test result value that indicates that the DUT failed, then the testing logic 108 determines at what point the DUT transitioned from a pass test to a fail test result value. The testing logic 108 then sets all test pairs located between the transition point and the end point having a test result value different from the transition point, equal to the test result value of the end point, as indicated in step 810. The testing logic 108 then sets the remaining test pairs in the current leg equal to the test result value of the transition point, as indicated in step 812. If all the legs have been tested and values have been obtained for all test pairs in each leg of the cross shmoo, as indicated in step 816, then the determination of the test result values ends as indicated in step 820. However, if all legs have not been tested, as indicated in step 816, then the testing logic 108 tests the next leg as indicated in step 818.

Figure 9:
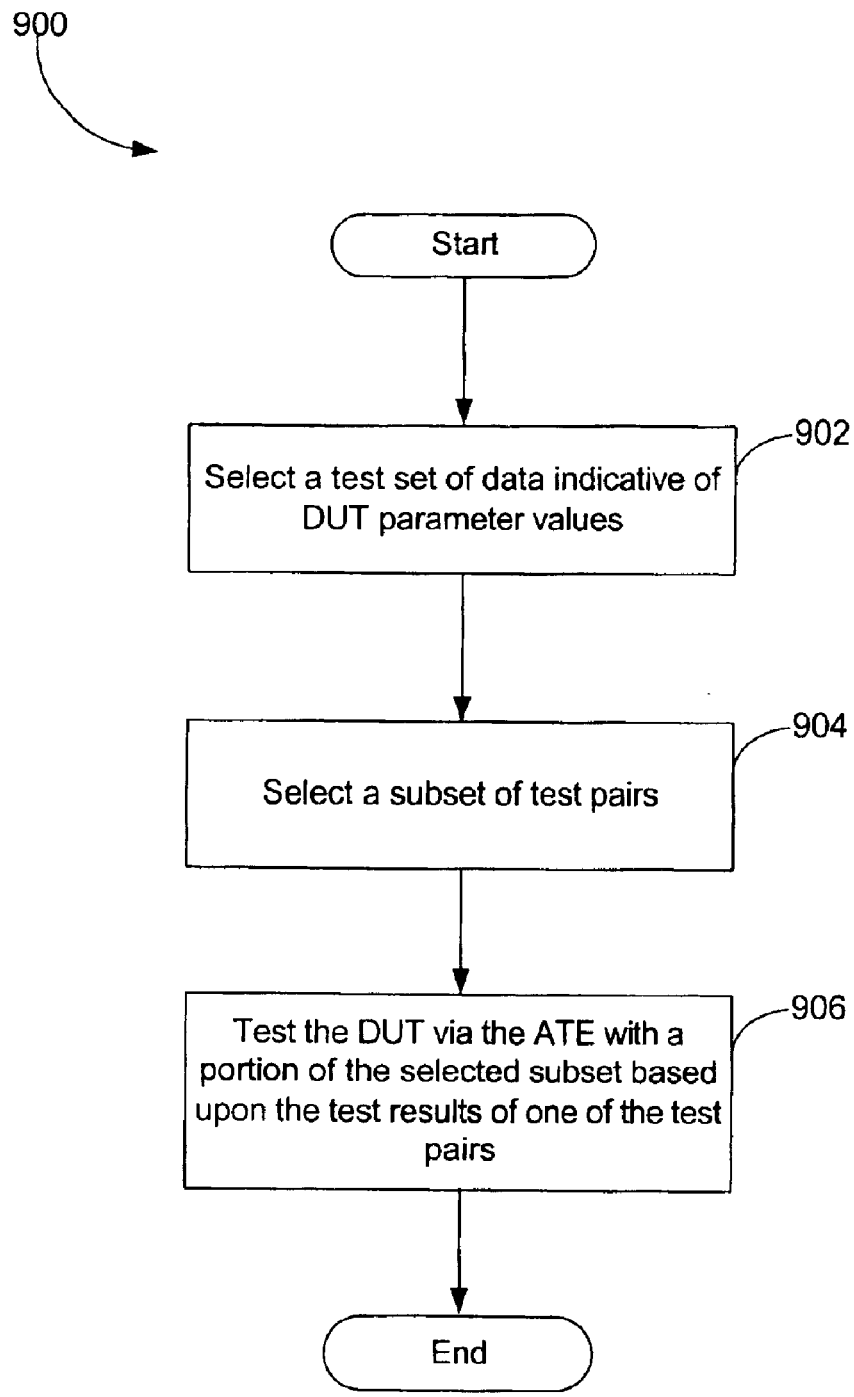
FIG. 9 is a flow chart of an exemplary device testing method.

A general description of an exemplary architecture and functionality of the device testing method 900 is now described with reference to FIG. 9. As indicated in step 902, the testing logic 108 selects a test set of data indicative of DUT parameter values. As described herein, DUT parameter values are values indicative of operational values, e.g., operational voltage, frequency, temperature, etc.

An exemplary logic 108 selects a subset of test pairs from the test set of data indicative of the DUT parameter values, as indicated in step 904. The testing logic 108 then tests the DUT with a portion of the subset, based upon the test results of one of the test pairs, as indicated in step 906.

Now, therefore, the following is claimed:

1. A device testing system comprising;
automated test equipment (ATE) configured to interface to a device under test (DUT); and
logic configured to select a test set of data comprising a plurality of test pairs, the test pairs indicative of DUT parameter values, the logic further configured to select a subset of the plurality of test pairs from the test set of data and to test the DUT via the ATE with a portion of the selected subset, the logic further configured to interpolate at least one other test result value corresponding to another test pair in the portion based upon a test result of at least one of the test pairs.

2. The system of claim 1, wherein the test set of data comprises test pairs indicative of operational parameters corresponding to the DUT.

3. The system of claim 2, wherein the subset of test pairs selected from the test set of test pairs is a cross shmoo.

4. A device testing system comprising;
automated test equipment (ATE) configured to interface to a device under test (DUT); and
logic configured to select a test set of data comprising a plurality of test pairs, the test pairs indicative of operational parameters corresponding to the DUT, the logic further configured to select a subset in the shape of a cross shmoo of the plurality of test pairs from the test set of data and to test the DUT via the ATE with a portion of the selected subset based upon a test result of at least one of the test pairs,
wherein the cross shmoo comprises a first leg, a second leg, a third leg, and a fourth leg, and wherein the logic is further configured to determine a first test result indicative of a first endpoint of the first leg and a second test result indicative of a second endpoint opposite the first endpoint, the logic further configured to calculate a transition point between the first endpoint and the second endpoint if the first test result and the second test result exhibit different values.

5. The system of claim 4, wherein the logic is further configured to calculate the transition point between the first and second endpoint by performing a binary search.

6. The system of claim 5, wherein the logic is further configured to determine a second transition point corresponding to the second leg, a third transition point corresponding to the third leg, and a fourth transition point corresponding to the fourth leg.

7. The system of claim 6, wherein the logic is further configured to predict a plurality of undetermined test results corresponding to at least a portion of the plurality of test pairs of the test set.

8. A device testing method, comprising the steps of:
selecting a test set of data comprising a plurality of test pairs, the test pairs indicative of device-under-test parameter values;
selecting a subset of test pairs from the plurality of test pairs;
testing the device-under-test via automated test equipment with a portion of the selected subset; and
interpolating at least one other test result value corresponding to another test pair in the portion based upon a test result of at least one of the test pairs.

9. The method of claim 8, wherein the test set of data comprises test pairs indicative of operational parameters corresponding to the device-under-test.

10. The method of claim 9, wherein the subset of test pairs selected from the test set of test pairs is a cross shmoo.

11. The method of claim 10, wherein the cross shmoo comprises a first leg, a second leg, a third leg, and a fourth leg.

12. A device testing method, comprising the steps of:
selecting a test data comprising a plurality of test pairs, the test pairs indicative of operational parameters corresponding to a device-under-test;
selecting a subset of test pairs from the plurality of test pairs, the subset of test pairs forming a cross shmoo and comprising a first leg, a second leg, a third leg, and a fourth leg;
testing the device-under-test via automated test equipment with a portion of the selected subset based upon a test result of at least one of the test pair; determining a first test result indicative of a first endpoint of the first leg and a second test result indicative of a second endpoint opposite the first endpoint; and
calculating a first transition point between the first endpoint and the second endpoint if the first test result and the second test result exhibit different values.

13. The method of claim 12, wherein the calculating step further comprises the step of performing a binary search to determine the first transition point between the first and second endpoints.

14. The method of claim 13, further comprising the steps of:
determining a second transition point between the first endpoint of the second leg and the second endpoint of the second leg;
determining a third transition point between the first endpoint of the third leg and the second endpoint of the third leg; and
determining a fourth transition point between the first endpoint of the fourth leg and the second endpoint of the fourth leg.

15. The method of claim 14, further comprising the step of predicting a portion of the test results for the plurality of test pairs within the test set based upon the first, second, third and fourth transition points.

16. The method of claim 15, wherein the predicting step comprises interpolating the transition points over the test set.

17. A device testing system, comprising:
automated testing equipment (ATE) interfaced to a device-under-test (DUT);
means for selecting a subset of a test set of test of test pairs for transmitting to the ATE for testing of the DUT;
means for testing the DUT with a portion of the subset of test pairs;
and logic configured to interpolate at least one test result value of one other test pair in the portion for the test set of test pairs based upon a subset of test results obtained from testing a portion of the subset.

18. A computer program for testing a device, the computer program being embodied on a computer-readable medium, the program comprising:
logic configured to select a test set of data comprising a plurality of test pairs, the test pairs indicative of device-under-test parameter values;
logic configured to select a subset of test pairs from the plurality of test pairs; and
logic configured to test the device-under-test via the automated testing equipment with a portion of the selected subset; and
logic configured to interpolate at least one test result value of one other test pair in the portion based upon the test results of at least one of the test pairs.

19. The computer program of claim 18, further comprising:
logic configured to predict test results for a portion of the plurality of test pairs of the test set; and
logic configured to display a plot indicative of the test results obtained by the logic configured to test and the logic configured to predict.

* * * * *